US008039797B2

(12) United States Patent
Hannebauer (10) Patent No.: US 8,039,797 B2
(45) Date of Patent: Oct. 18, 2011

(54) SEMICONDUCTOR FOR SENSING INFRARED RADIATION AND METHOD THEREOF

(75) Inventor: Robert Hannebauer, Vancouver (CA)

(73) Assignees: Han Vision Co., Ltd. (KR); Lumiense Photonics Inc. (CA)

( * ) Notice: Subject to any disclaimer, the term of this patent is extended or adjusted under 35 U.S.C. 154(b) by 358 days.

(21) Appl. No.: 12/270,418

(22) Filed: Nov. 13, 2008

(65) Prior Publication Data

US 2010/0116988 A1 May 13, 2010

(51) Int. Cl.
*G01J 5/00* (2006.01)

(52) U.S. Cl. ............. 250/338.1; 250/338.4; 250/339.01; 250/349; 257/30

(58) Field of Classification Search ............... 250/338.1, 250/338.4, 339.01, 349; 257/30, E21.001
See application file for complete search history.

(56) References Cited

U.S. PATENT DOCUMENTS

| 5,486,698 | A | * | 1/1996 | Hanson et al. | 250/332 |
| 5,656,816 | A | * | 8/1997 | Tanaka | 250/339.01 |
| 2001/0025926 | A1 | * | 10/2001 | Mashio et al. | 250/338.4 |
| 2002/0040967 | A1 | * | 4/2002 | Oda | 250/338.1 |
| 2009/0008556 | A1 | * | 1/2009 | Dupont et al. | 250/338.1 |
| 2009/0152470 | A1 | * | 6/2009 | Dupont et al. | 250/340 |
| 2010/0038540 | A1 | * | 2/2010 | Hannebauer | 250/338.1 |

FOREIGN PATENT DOCUMENTS

WO   WO 2007032632 A1 * 3/2007

OTHER PUBLICATIONS

Hwang et al. "Pixel Readout Circuit with Current Mirroring Injection for Microbolometer FPAs." Electronics Letters (44) 12: p. 1-2.*
Tanaka et al. (2003). "Performance of 320x240 Uncooled Bolometer-type Infrared Focal Plane Arrays." Proc. SPIE vol. 5074: p. 414-424.*

* cited by examiner

*Primary Examiner* — David Porta
*Assistant Examiner* — Casey Bryant
(74) *Attorney, Agent, or Firm* — Cantor Colburn LLP (57) ABSTRACT

A semiconductor device for sensing infrared radiation is provided. In an embodiment, the semiconductor device includes a sensor configuration which includes a light receiving portion for converting incident photons into heat and a sensing portion integrated with the light receiving portion and having a resistance varying according to the converted heat; and a sensing circuit which includes a common mode current providing portion and a current subtraction portion, wherein the common mode current providing portion outputs a common mode current related to a value of a current which is flowing in the sensing portion when there is no incident light and the current subtraction portion outputs subtraction currents for the common mode current and a sensing current related to a current output from the sensing portion.

In another embodiment, the sensing configuration includes a heat removing portion which is disposed to form an empty space between the heat removing portion and the light receiving portion and the sensing portion, and removes accumulated heat from the light receiving portion and the sensing portion, and the sensing circuit includes an actuating voltage supplying portion which applies electric potential between the sensing portion and the heat removing portion to make the light receiving portion and the sensing portion elastically deflect into the empty space and consequently contact the heat removing portion to remove the heat.

7 Claims, 9 Drawing Sheets

SEMICONDUCTOR FOR SENSING INFRARED RADIATION AND METHOD THEREOF

TECHNICAL FIELD

The following description relates to a semiconductor device and a method of fabricating the same.

BACKGROUND

Various methods have been employed to implement devices for sensing infrared radiation. Among infrared sensors, microbolometer infrared sensors are notable, because of the method used to sense infrared rays; by measuring an electric signal that changes according to temperature differences caused by absorbed heat from infrared rays.

Typically, a non-cooled infrared sensor such as a microbolometer includes a light receiving portion and a detecting portion. The light receiving portion converts energy of photons into heat, and the detecting portion detects electric signals, such as resistance, capacitance, and pyroelectric effect, which change according to the temperature caused by the heat converted by the light receiving portion.

The conventional infrared sensors, especially, a resistive sensor includes a resistive detecting element which may be vanadium oxide (VOx), poly-silicon, amorphous-silicon, thermistor $(MnNiCO)_3O_4$ or a diode. VOx has an advantageously good resistance change rate to temperature change, whereas it has a fatal disadvantage that the flicker noise is excessively large. Thus, the conventional resistive infrared sensor using such material as the resistive detecting element, has system performance that drastically deteriorates (especially at a low frequency where the influence of flicker noise substantially increases). To solve the problem such as the flicker noise, titanium with a very small flicker noise has been used for the resistive detecting element. However, since material such as titanium has a too small resistance change rate to temperature change, it is not suitable for the detecting element of the infrared sensor.

Furthermore, according to the conventional art, sometimes a mechanical chopper is externally provided to the infrared sensor to improve the sensor's performance in sensing infrared radiation. This is used principally for ferroelectric devices and sometimes (but not necessarily) for microbolometers. The mechanical chopper periodically cuts off photons to maintain a detecting element below a reference temperature. The mechanical chopper, when used, greatly increases the complexity of an infrared detecting system. That is, the mechanical chopper complicates the assembly processes of the infrared sensing system, increases the manufacturing cost, and causes various limitations in operation.

Moreover, the semiconductor device includes a detecting element that outputs electric current, and the output electric current responding to light has a significantly weak intensity. Since the magnitude of a common mode current which is output in dark conditions is significantly large and the common mode current itself changes according to temperature, it is difficult to accurately measure a sensing current output from a sensor.

Furthermore, according to the conventional art, all non-cooled thermal imaging detectors suffer from image lag, where in image lag is the remaining parts of one frame of a video still being present in the current frame of video. This effect manifests itself as a smearing and ghosting.

SUMMARY

In one aspect, there is provided a semiconductor device which includes a sensing structure that improves infrared radiation sensing performance, and an operating method thereof.

In another aspect, there is provided a semiconductor device which efficiently resets heat accumulated in the course of sensing infrared radiation, and an operating method thereof.

In another aspect, there is provided a semiconductor device which eliminates or minimizes effects of variation in a common mode current, and an operating method thereof.

According to still another aspect, there is provided a semiconductor device for sensing infrared radiation comprising a light receiving portion which converts incident photons into heat, a sensing portion of which resistance varies according to heat converted by the light receiving portion, a sensor configuration which includes a heat removing portion for removing heat accumulated in the light receiving portion and the sensing portion, and a sensing circuit which is connected to the sensor configuration to detect infrared radiation based on changes in resistance, wherein an empty space is formed between the heat removing portion and the light receiving portion and sensing portion, and the sensing circuit includes an actuating voltage which applies electric potential between the sensing portion and the heat removing portion such that the light receiving portion and the sensing portion elastically deflect into the space to contact the heat removing portion, thereby enabling the accumulated heat to be removed from the light receiving portion and the sensing portion.

Other features will become apparent to those skilled in the art from the following detailed description, which, taken in conjunction with the attached drawings, discloses exemplary embodiments of the invention.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1A:
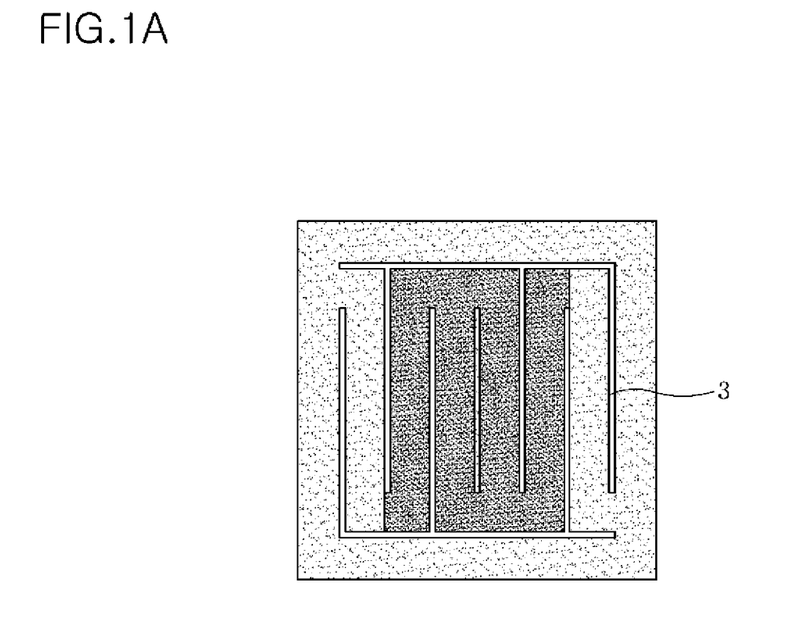
FIG. 1A is a top view of a semiconductor device according to an exemplary embodiment.
Figure 1B:
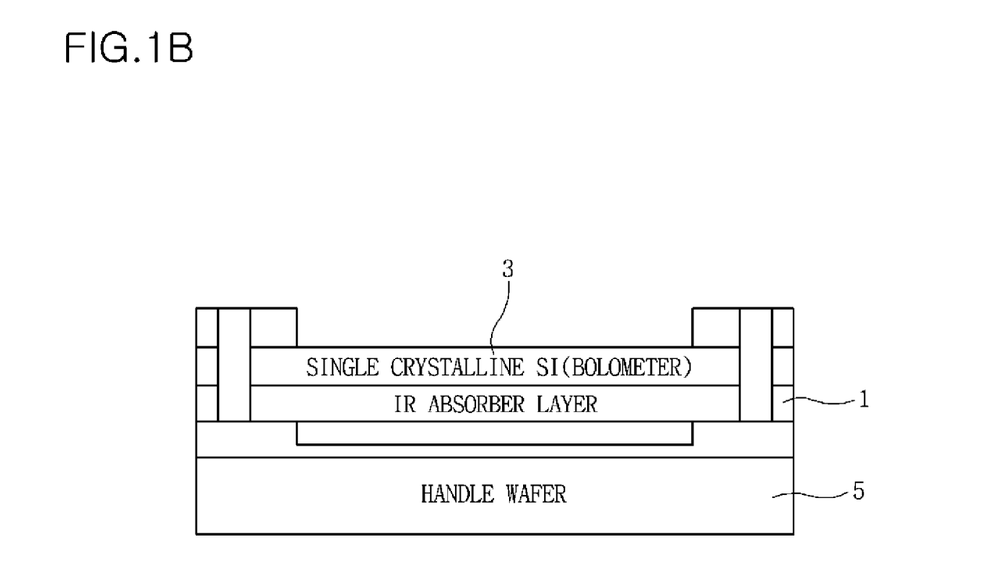
FIG. 1B is a front view of the semiconductor device in FIG. 1B.

FIG. 1A is a top view of a semiconductor device according to an exemplary embodiment, and FIG. 1B is a front view of the semiconductor device in FIG. 1B. The semiconductor device includes a light receiving portion 1, a sensing portion 3, and a handle wafer 5. The light receiving portion 1 may be formed of multiple layers of various materials such as SiO and $Si_3N_4$, which are compatible with CMOS fabrication processes, to convert energy of incident photons into heat.

According to an exemplary embodiment, single crystalline silicon is used for the sensing portion 3, which is a resistive sensing element, by the use of a thin-film transfer technology. The single crystalline silicon has a temperature coefficient of resistance (TCR) of about 0.2%/° K, which is smaller than TCR of 2 to 3%/° K of, for example, vanadium oxide (VOx), poly-silicon, amorphous-silicon, thermistor (($MnNiCO)_3 O_4$), and a diode. Thus, the single crystalline silicon has a small resistance change rate to the temperature change. However, since the single crystalline silicon has mainly Johnson noise which can be calculated by Equation 1 below whereas the poly-silicon or amorphous-silicon has mainly flicker noise, the single crystalline silicon may have a substantially small amount of noise.

$$v_n = \sqrt{4KTBR} \qquad \text{Equation 1}$$

Here, Vn represents Johnson noise, K denotes Boltzmann constant, B denotes a frequency band, and R represents resistance.

The sensing portion 3 in accordance with the exemplary embodiment has its resistance maximized such that signal-to-noise ratio (SNR) is maximized to dramatically enhance the performance of the semiconductor device.

The reasons for maximizing the resistance are as follows:

First, with reference to Equation 2 below, it can be understood that the resistance needs to be maximized since the current should be reduced in order to maximize the amplitude of a signal with respect to the heat increase caused by the self-bias of the sensing portion 3.

$$S/P = \frac{TCR \cdot \Delta T}{i} \qquad \text{Equation 2}$$

Here, S represents the amplitude of a signal, P represents power of the self-bias, TCR stands for temperature coefficient of resistance, $\Delta T$ represents a temperature variation, and i denotes electric current.

Second, with reference to Equation 3 below, to increase SNR, the resistance is required to be maximized.

$$SNR = \frac{(i \cdot (TCR) \cdot \Delta T \cdot \sqrt{R})}{\sqrt{4KTB}}$$

Here, SNR stands for "signal-to-noise ratio", i denotes electric current, TCR stands for "temperature coefficient of resistance", $\Delta T$ represents a temperature variation, R denotes resistance, K denotes Boltzmann constant, T represents temperature, and B represents a frequency band.

According to the exemplary embodiment, there are two ways of maximizing the resistance in the sensing portion 3 which is a resistive sensor.

First, as shown in FIG. 1A, the sensing portion 3 is formed in a serpentine structure with narrow width and curved shape on a single crystalline Si layer, so that the resistance can be increased. According to another exemplary embodiment, the light receiving portion 1 may have a typical shape such as a rectangle to maximize the heat conversion efficiency. To make the sensing portion 3 protrude to an external surface, the sensing portion 3 is patterned first and subsequently the following process such as laminating the light receiving portion 1 is carried out. Second, coefficient of thermal expansion (CTE) of the single crystalline silicon of the sensing portion 3 is $2.6*10^{-6}$ and CTE of nitride ($Si_3N_4$) which forms the light receiving portion 1 is $3.3*10^{-6}$. Thus, nitride ($Si_3N_4$) or dielectric layer formed of multiple layers applies thermal stress to the single crystalline silicon, which has piezoresistance that is changed by the stress, so that the resistance of the sensing portion 3 can be increased. For this reason, the sensing portion 3 can have an effect that the resistance has changed greater than the TCR. Resistance of a silicon substrate varies according to a density of impurities in the silicon substrate, and the additional change in the resistance can be achieved by adjusting a doping level of a single crystalline silicon thin film.

Referring to FIGS. 1A and 1B, the semiconductor device in accordance with the exemplary embodiment is implemented in a micro electro mechanical system (MEMS) structure. Accordingly, the semiconductor device in the MEMS structure can be thermally reset with efficiency even without a mechanical chopper, and the MEMS structure realizes high-speed operation of the semiconductor device by allowing the performance of the sensing portion to be independent to its sensitivity.

A thin-film transfer technology will be described with reference to FIGS. 2 to 6, and the MEMS structure will be described in detail with reference to FIGS. 7 to 9.

FIGS. 2 to 6 schematically show procedures of the thin-film transfer in accordance with an exemplary embodiment.

Figure 2:
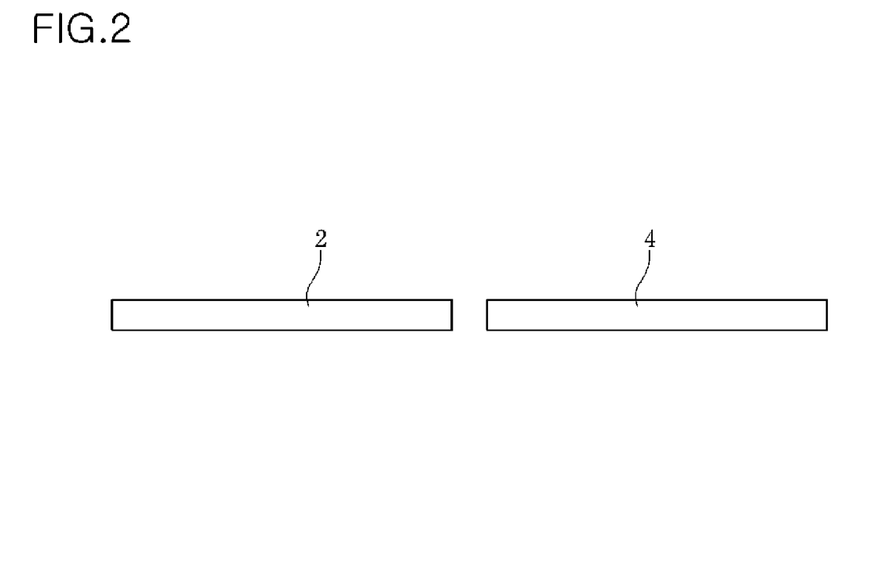
FIGS. 2 to 6 schematically show procedures of thin-film transfer according to an exemplary embodiment.

Referring to FIGS. 2 to 6, as shown in FIG. 2, a handle wafer 2 is placed on the left and a donor wafer 4 is on the right. Both the handle wafer 2 and the donor wafer 4 are covered with thermal oxide (not shown).

Figure 3:
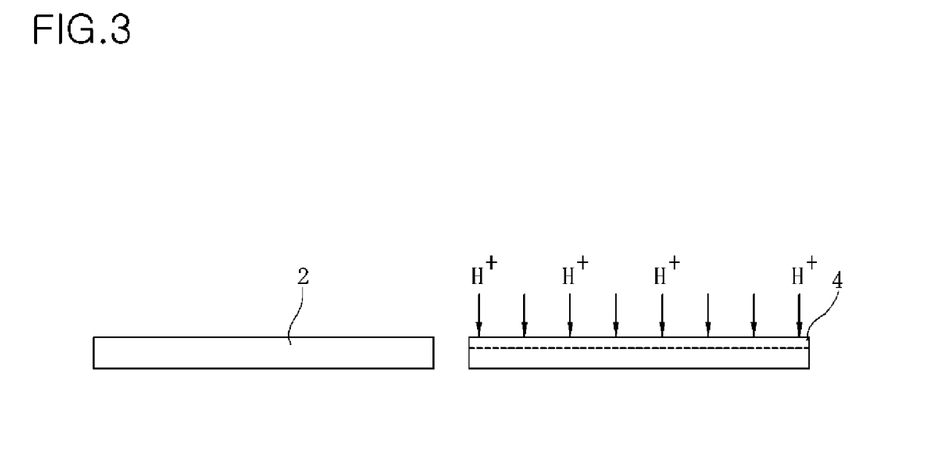
Figure 4:
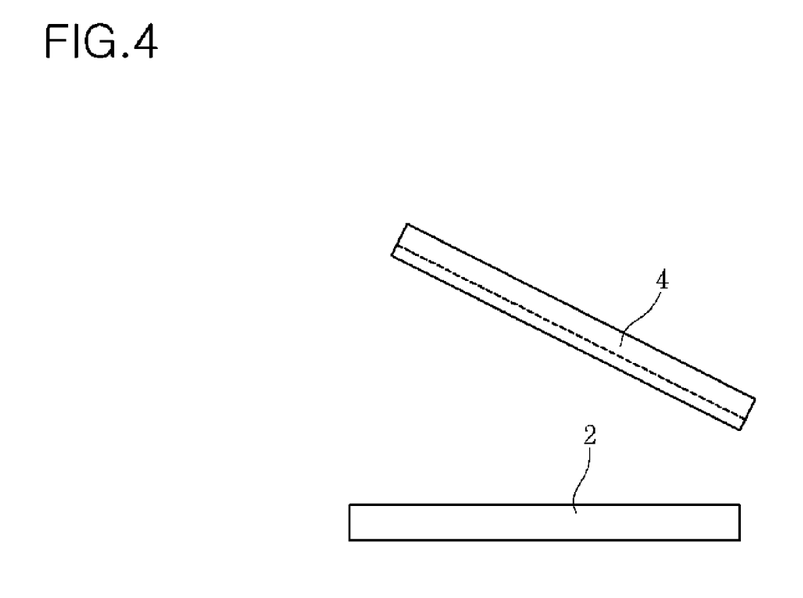
Figure 5:
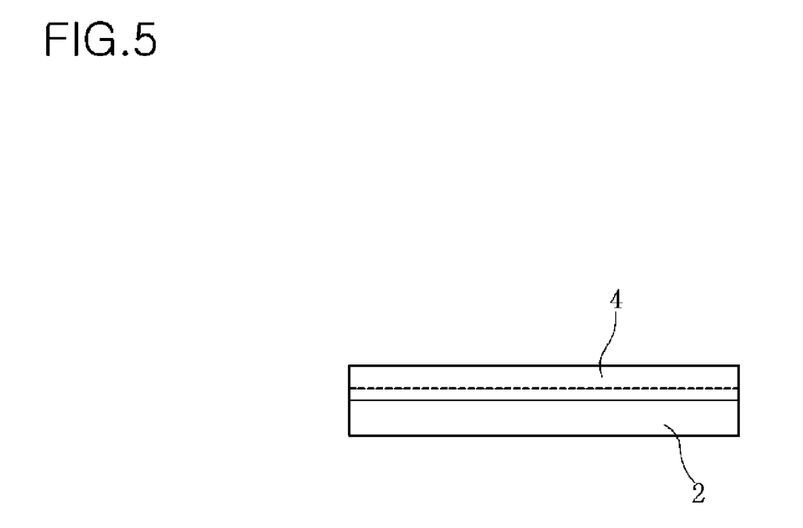

On the donor wafer 4, as shown in FIG. 3, hydrogen (H+) is implanted to a certain depth. The implanted hydrogen weakens the connection force of the donor wafer 4 at a particular depth. Especially, when the concentration of hydrogen exceeds solid solubility in silicon, a large amount of hydrogen functions as a partition in the course of wafer cutting. Then, as shown in FIG. 4, the donor wafer 4 covers the handle wafer 2. At this time, the surface of the donor wafer 4 on which the hydrogen implanting has been performed is disposed to touch the handle wafer 2. Consequently, as shown in FIG. 5, the donor wafer 4 and the handle wafer 2 are bonded to each other. Although not shown in drawings, plasma may be used to accelerate the bonding process.

Once the two wafers have contacted to each other, the boding between the wafers is started by applying point-pressure to each surface of the wafers at room temperature. When the bonding of wafers is complete, a strong bonding force, which corresponds to 80% of a common bonding force, is provided between the wafers through annealing process, this occurs later in the process. The wafers according to the exemplary embodiment can also be naturally annealed by utilizing heat created in the course of transistor fabrication process. In this case, loss of doping material caused by diffusion during the implanting process can be minimized.

Figure 6:
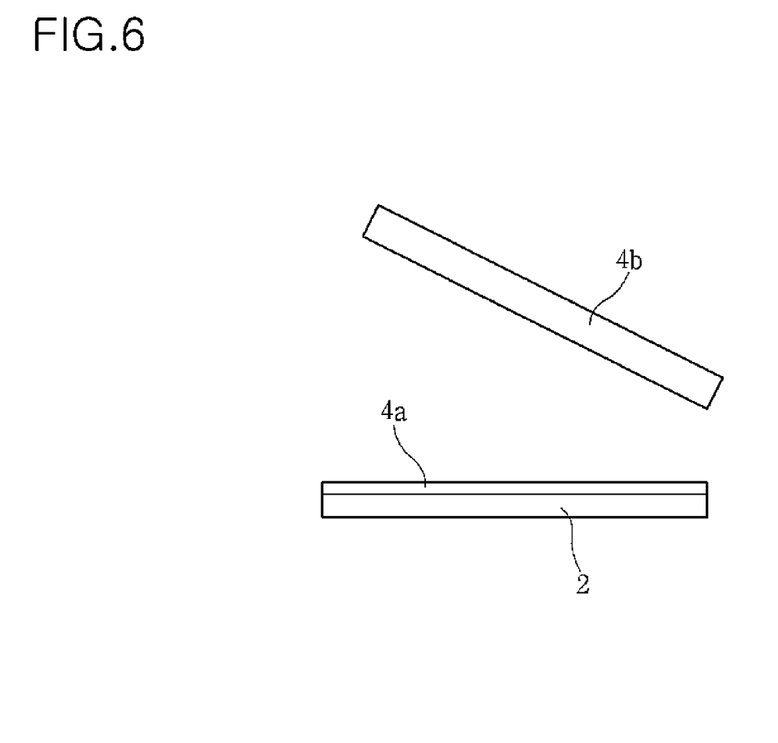

When the bonding of the wafers is complete, the bonded wafers undergo a thermal process. By the thermal process, hydrogen ions in silicon of the donor wafer 4 gather together, and the donor wafer 4 is divided into two portions 4a and 4b, as shown in FIG. 6, as the donor wafer 4 is cut off along a crystalline surface. A portion 4b of the donor wafer 4 can be reused several times by polishing, forming a silicon-oxide layer thereon and cleaning it.

In the exemplary embodiment, the thin-film transfer employs the Smart Cut process by which the hydrogen ions are implanted into the donor wafer 4. However, the SiGen's NanoCleave™ process can be employed for the thin-film transfer of the present exemplary embodiment. In the NanoCleave™ process, a silicon layer and a SiGe layer are formed on a donor wafer to transfer the thin film. In this case, a thin-film is formed with a Si-EPI deposition method instead of thermal oxide layer formation and hydrogen implanting process such that only the silicon layer is bonded and transferred at room temperature. A low-cost silicon-on-insulator (SOI) process such as SIMOX enables realization of an inexpensive sensor.

Figure 7:
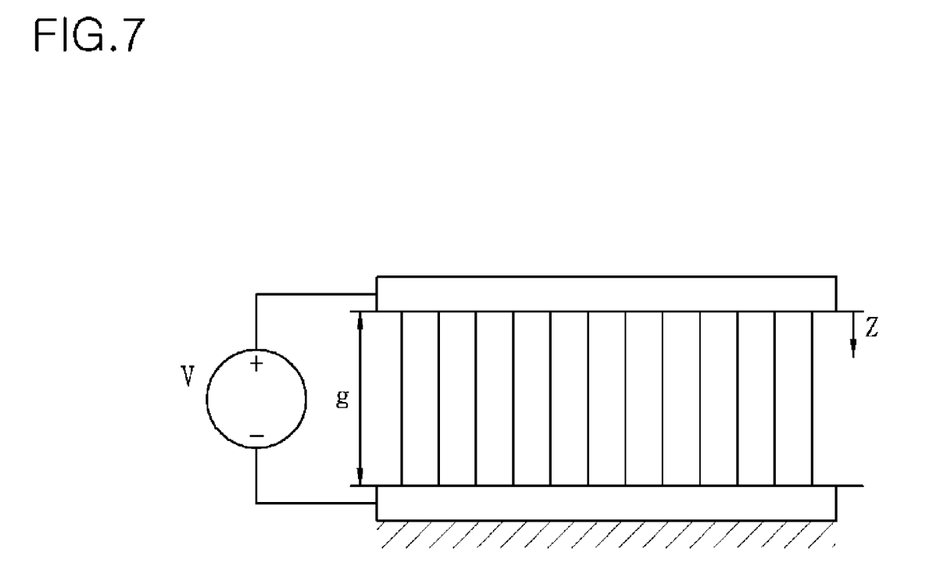
FIG. 7 is an illustration for explaining an MEMS structure according to an exemplary embodiment.

FIG. 7 is an illustration for explaining an MEMS structure according to an exemplary embodiment. Referring to FIG. 7, the MEMS structure employed to the semiconductor device in accordance with the present invention is an electrostatic configuration. In the electrostatic configuration, electrostatic suction force is generated at both ends of a parallel plate capacitor by applying an electric potential difference between the ends. The electrostatic suction force can be calculated by Equation 4 below.

$$F = \frac{1}{2} \times \frac{\varepsilon A V^2}{(g-z)^2} \qquad \text{Equation 4}$$

Here, F represents electrostatic attraction force, ∈ denotes dielectric constant, A represents the width of a capacitor, V denotes the electric potential difference, and (g−z) represents a distance between the ends.

Figure 8:
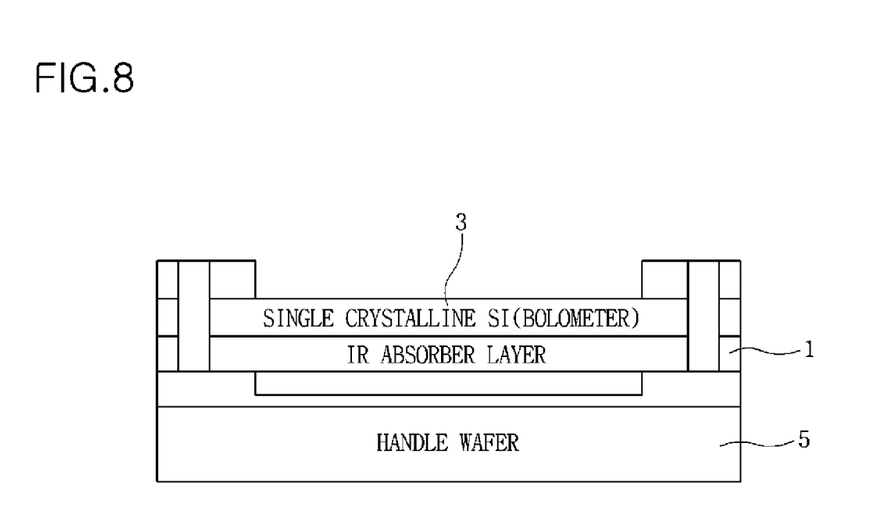
FIG. 8 is a front view of a semiconductor device during a sensing period according to an exemplary embodiment.
Figure 9:
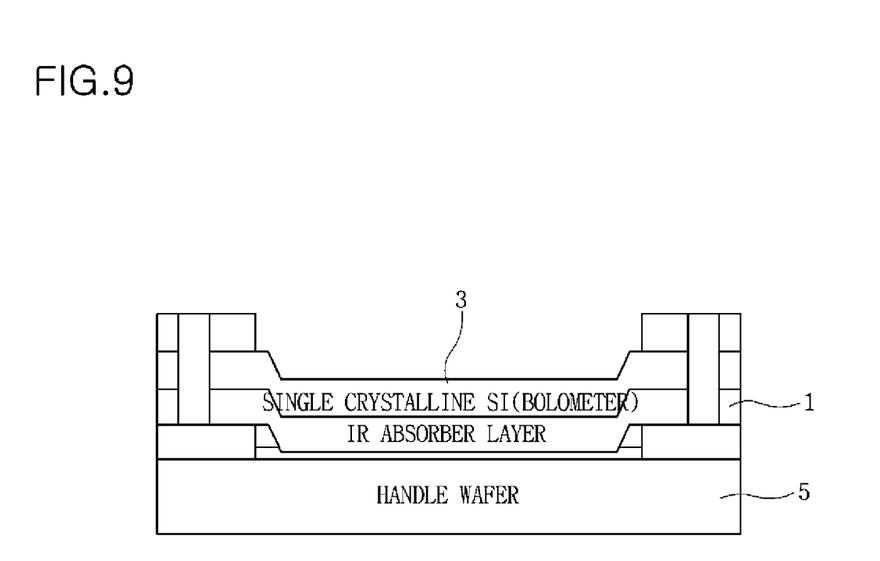
FIG. 9 is a front view of the semiconductor device during an accumulated heat reset period according to an exemplary embodiment.

FIG. 8 is a front view of a semiconductor device during a sensing period according to an exemplary embodiment, and FIG. 9 is a front view of the semiconductor device during an accumulated heat reset period according to an exemplary embodiment.

Referring to FIGS. 8 and 9, during the sensing period, a light receiving portion 1 of the semiconductor device converts energies of photons incident into heat, a sensing portion 3 changes a resistance value according to a change of converted heat. The heat converted from the energies of photons is accumulated during the sensing period. In order to improve the performance of the semiconductor device, the accumulated heat is reset in the MEMS-based reset structure, so that pixel reset can be effectively performed.

That is, when an electric potential difference is applied between a handle wafer 5 which is an heat removing portion and the sensing portion 3, electrostatic attraction force is generated between the light receiving portion 1, the sensing portion 3, and the handle wafer 5, and by the generated electrostatic attraction force, parts of respective IR absorber layer 1 and sensing portion 3 elastically deflect to be closer to the handle wafer 5. A space between the deflecting parts of the light receiving portion 1 and the sensing portion 3 and the handle wafer 5 is empty, from which $SiO_2$ is removed by wet etching. While the parts of the light receiving portion 1 and the sensing portion 3 elastically deflect to contact the handle wafer 5 (an accumulated heat reset period), the heat accumulated on the light receiving portion 1 and the sensing portion 3 is transferred to the handle wafer 5, thereby being reset.

Subsequently, when an applied voltage is released, the parts of the light receiving portion 1 and the sensing portion 3 which are contacting the handle wafer 5 are restored to the original state as shown in FIG. 8 by the elastic energy stored in the deflecting parts.

Although, for convenience of explanation, the handle wafer 1 functions as the heat removing portion according to the exemplary embodiment, any other element can be the heat removing portion as long as it has a configuration (including a multi-layered configuration) in which the heat accumulated on the light receiving portion 1 and the sensing portion 3 can be transferred to the element that is disposed near the light receiving portion 1 and the sensing portion 3, parts of which elastically deflect by electrostatic attraction force generated by an electric potential difference applied to the element and the light receiving portion 1 and the sensing portion 3.

According to the exemplary embodiment, the sensing portion 3, for which single crystalline silicon is employed by the use of the thin-film transfer method, enables effective elastic deflection and restoration in the MEMS-based reset structure, and thereby dramatically improving the performance and lifetime of the semiconductor device. If conventional polysilicon or amorphous-silicon is employed for the MEMS-based reset structure, the elastic transformation and restoration does not properly take place, and hence the desired performance and lifetime cannot be achieved. Since the semiconductor device in accordance with the exemplary embodiment has a MEMS-based reset structure, transistors can be disposed at a lower part of each of the light receiving portion 1 and the sensing portion 3, so that an additional horizontal space is not required.

According to another exemplary embodiment, to enhance the performance of the semiconductor device, in addition to the MEMS-based reset structure, a Peltier cooler may be added to the semiconductor device to provide more stable reference temperature.

Figure 10:
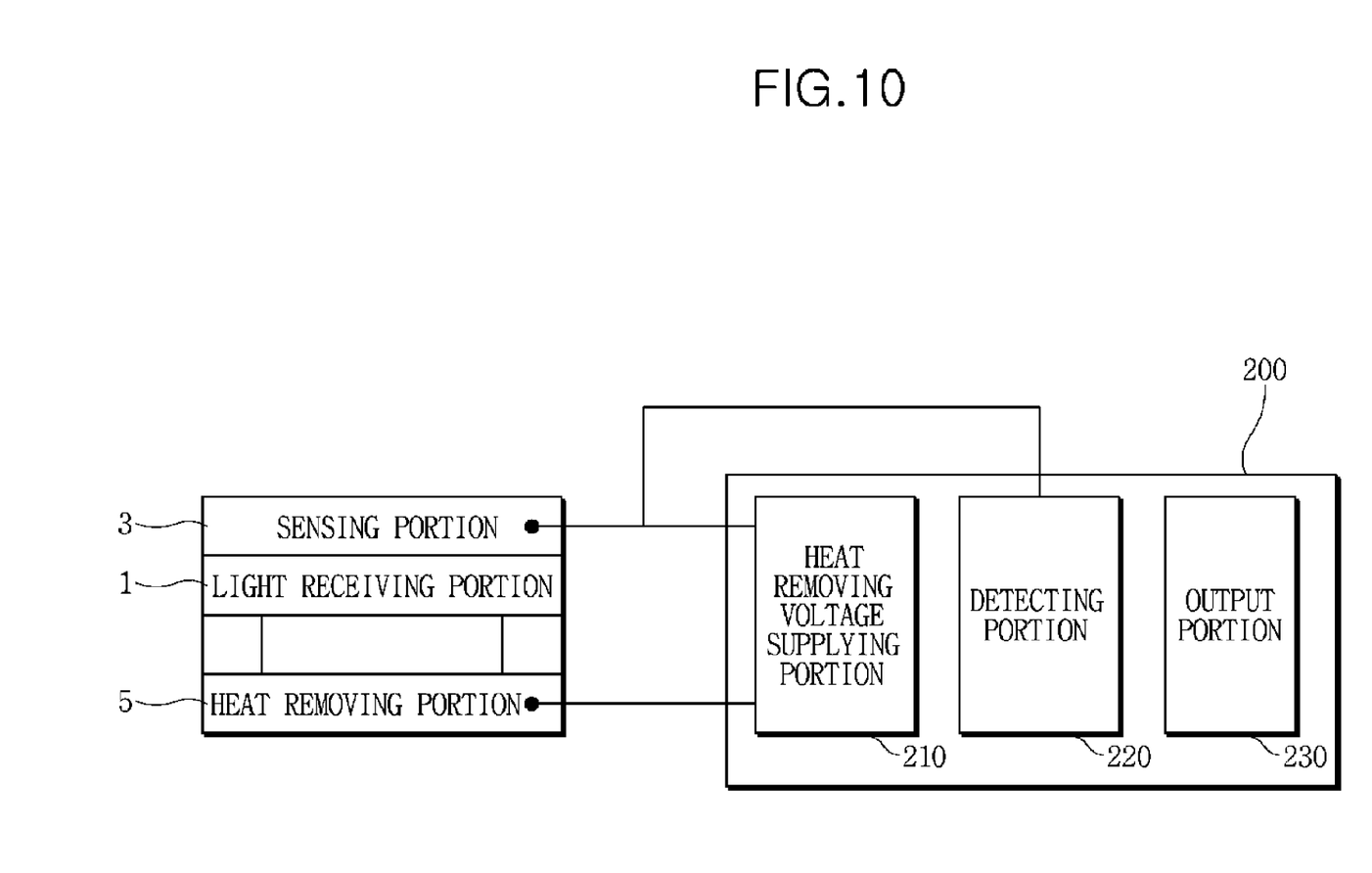
FIG. 10 is a block diagram of a semiconductor device including a sensing structure portion and a sensing circuit according to an exemplary embodiment.

FIG. 10 is a block diagram of a semiconductor device including a sensing structure portion and a sensing circuit according to an exemplary embodiment.

Referring to FIG. 10, the semiconductor device includes a sensor configuration 100 and a sensing circuit 200. The sensor configuration 100 includes a light receiving portion 1, a sensing portion 3, and a heat removing portion 5, for example, a handle wafer. The sensing circuit 200 applies an electric potential difference between the heat removing portion 5 and the sensing portion 3 to reset the heat accumulated in the light receiving portion 1 and the sensing portion 3 and detects the voltage change due to the accumulated heat. Although the sensing circuit 200 is illustrated as a block separated from the sensor configuration 100, it may be disposed on an SOI thin-film layer for the transistor formation on the same semiconductor wafer as the sensor configuration 100.

The sensing circuit 200 includes a heat removing voltage supplying portion 210, a detecting portion 220, and an output portion 230. The heat removing voltage supplying portion 210 applies voltage having a higher electric potential to the heat removing portion 5 than to the sensing portion 3 in order that the heat accumulated in the light receiving portion 1 and the sensing portion 3 is reset. As described above, the electric potential difference is possible to be applied to both the light receiving portion 1 and the sensing portion 3 as long as the light receiving portion 1 and the sensing portion 3 can contact the heat removing portion 5 by the electrostatic attraction force to dump the accumulated heat to the heat removing portion 5.

The heat removing voltage supplying portion 210 applies an electric potential difference between the heat removing portion 5 and the sensing portion 3 such that the light receiving portion 1 and the sensing portion 3 elastically deflect by an electrostatic attraction force to contact the heat removing portion 5. The heat removing voltage supplying portion 210 applies a voltage of, for example, about 0 volt to the sensing portion 3 and a voltage of about 4 volts to the heat removing portion 5 to reset the accumulated heat.

The sensing portion 3 has its resistance changed according to the heat converted by the light receiving portion 1, and may be formed of a single crystalline silicon film by an SOI substrate fabrication method.

The detecting portion 220 is connected with the sensing portion 3 to detect a quantity of change in resistance. Bolometric sensing requires that the received IR radiation causes a parametric shift in a resistance characteristic. This means that the temperature signal is a small signal on top of a large common mode signal. For example, with a TCR of 1%/C, a resistor of 1 MΩ will change by 10 kΩ for every degree of temperature. To detect to the 10 mK level, 100Ω difference must be detected on a common mode signal of 1 MΩ.

The output portion 230 outputs a voltage value corresponding to the quantity of change in resistance. The output portion 230 can be implemented as a complementary metal-oxide semiconductor (CMOS) image sensor (CIS) scan circuit which detects a voltage value corresponding to the detected infrared.

Figure 11A:
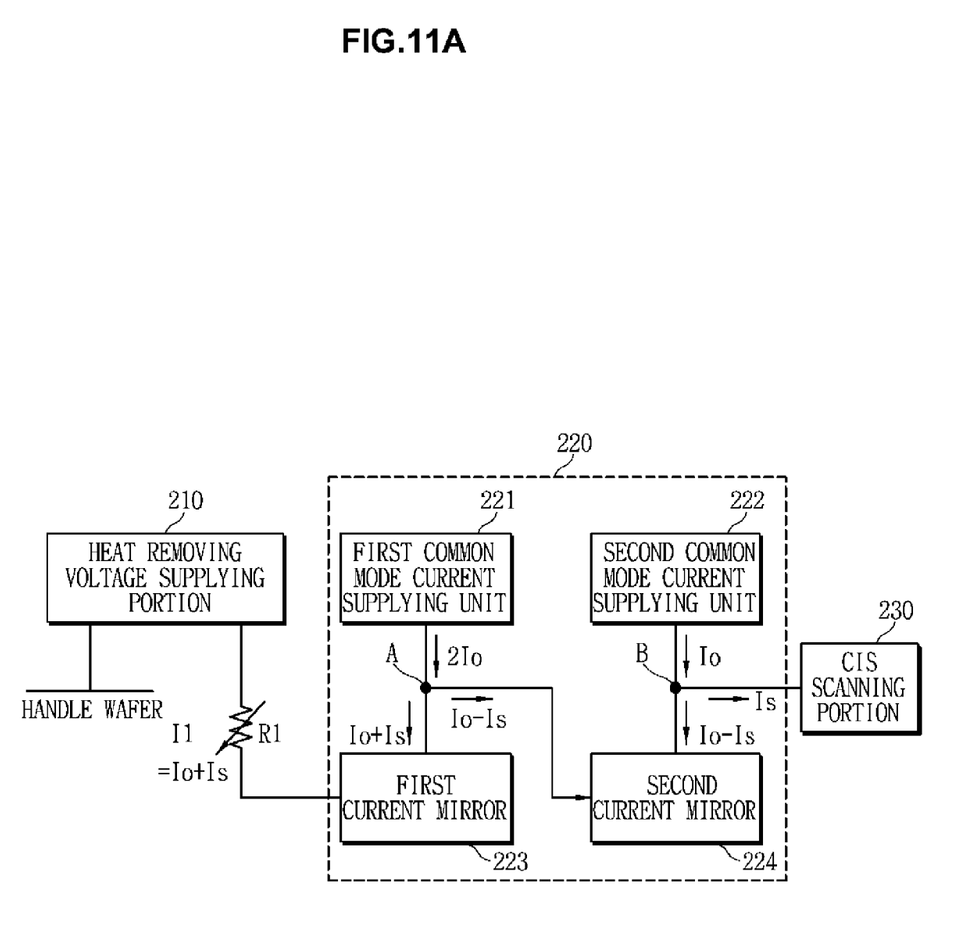
FIGS. 11A and 11B are block diagrams schematically showing a pixel circuit of an infrared sensor according to an exemplary embodiment.
Figure 11B:
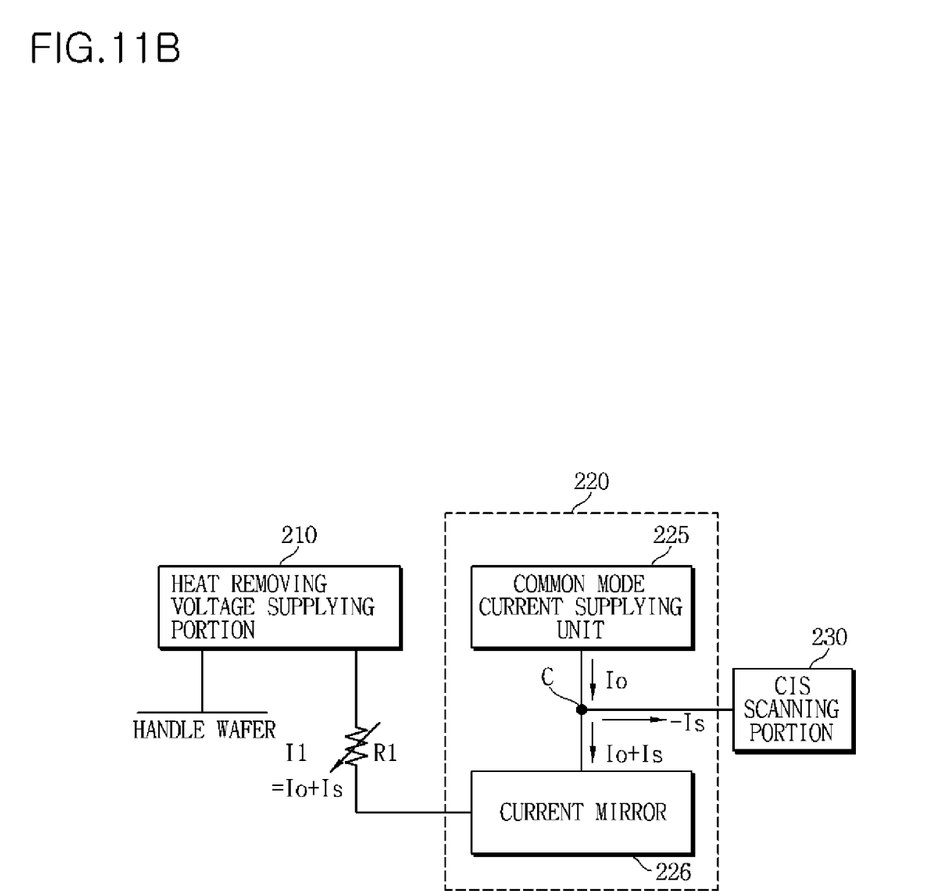

FIGS. 11A and 11B are block diagrams schematically showing a pixel circuit of an infrared sensor according to an exemplary embodiment. In FIGS. 11A and 11B, the sensing portion 3 is illustrated as a variable resistor R1, and the output portion 230 in FIG. 10 is illustrated as a CIS scanning portion 230.

The current flowing in the sensing portion R1 includes a large common mode current, which is caused by the large common mode resistance that is the initial resistance before the applying of the infrared, and a signal current caused by the resistance changes according to the absorbed thermal energy.

The electric current flowing in the sensing portion R1 is represented by Equation 5 below.

$$I1=(V\text{pix}-V_{DS})/R1 \quad \text{Equation 5}$$

Here, Vpix represents a voltage applied to one end of the sensing portion R1, $V_{DS}$ represents a drain source voltage of a transistor N1 (referring to FIG. 12), and RI represents a resistance value of the sensing portion 3. The resistance value R1 can be represented by, for example, 100 kΩ+ΔR. ΔR represents a resistance value that changes according to temperature change.

Therefore, if the current I1 is I0 at a certain temperature T1, the current I1 can be Io (common mode current)+Is (signal current by ΔR) at another temperature.

As shown in FIGS. 11A and 11B, the detecting portion 220 provides a common mode current Io which flows at a state before the input of photons, that is, when the resistance of the sensing portion R1 is the initial resistance, and outputs information according to the changed resistance of the sensing portion R1 by subtracting the current, which flows in the sensing portion R1 when the resistance of the sensing portion R1 changes after the input of photons, from the common mode current Io. Since a semiconductor device has its characteristics determined according to the size of the device or the degree of doping, it is easy to form the semiconductor device to have a portion having resistance identical with the resistance or to be a multiple of the resistance of the sensing portion R1 due to the development of semiconductor design and fabrication technology.

To this end, the detecting portion 220 includes a first common mode current supplying portion 221, a second common mode current supplying portion 222, a first current mirror 223, and a second current mirror 224, as shown in FIG. 11A. The first common mode current supplying portion 220 provides a current 2Io which is twice of the current Io that flows in the sensing portion R1 when the resistance of the sensing portion 3 is the initial resistance before input of the photons. The current flowing from a node A to the first current mirror 223 is identical with the current of the sensing portion R1, and thus the current flowing from the node A to the second current mirror is Io−Is. In this case, the node A is the simplest example of a current subtraction circuit that subtracts a current. However, the present invention is not limited to the above-described circuit.

The second common mode current supplying portion 222 provides a current Io of when the resistance is the initial value before input of the photons. Since the current input from a node B to the second current mirror 224 is identical with the current from a node A to the second current mirror 224, the current flows from the node B to the CIS scanning portion 230 becomes a current Is corresponding to the varied resistance of the sensing portion R1. In this case, the node B is the simplest example of a current subtraction circuit that subtracts a current. However, the present invention is not limited to the above-described circuit.

According to another exemplary embodiment, the detecting portion 220 can be simplified to include one common mode current supplying portion 225 and one current mirror 226 as shown in FIG. 11B. The common mode current supplying portion 225 provides a current Io to the sensing portion R1. The current Io is the current of when the resistance of the sensing portion R1 is the initial resistance before input of the photons. Since the current mirror 226 enables the current having the same amount of current which flows in the sensing portion R1 to flow from a node C to the current mirror 226, a current Is to flow from the node C to the CIS scanning portion 230 corresponds to the changed resistance of the sensing portion R1. Both the node C connecting the common mode current supplying portion 225 to the current mirror 226 and the current mirror 226 are current subtraction circuits. In this case, the node C is the simplest example of a current subtraction circuit which subtracts a current. However, the present invention is not limited to the above-described circuit. While the embodiment illustrated in FIG. 11A has a rather complicated structure, the circuit in this embodiment has an advantage in that a positive (+) sensing current is output.

Figure 12:
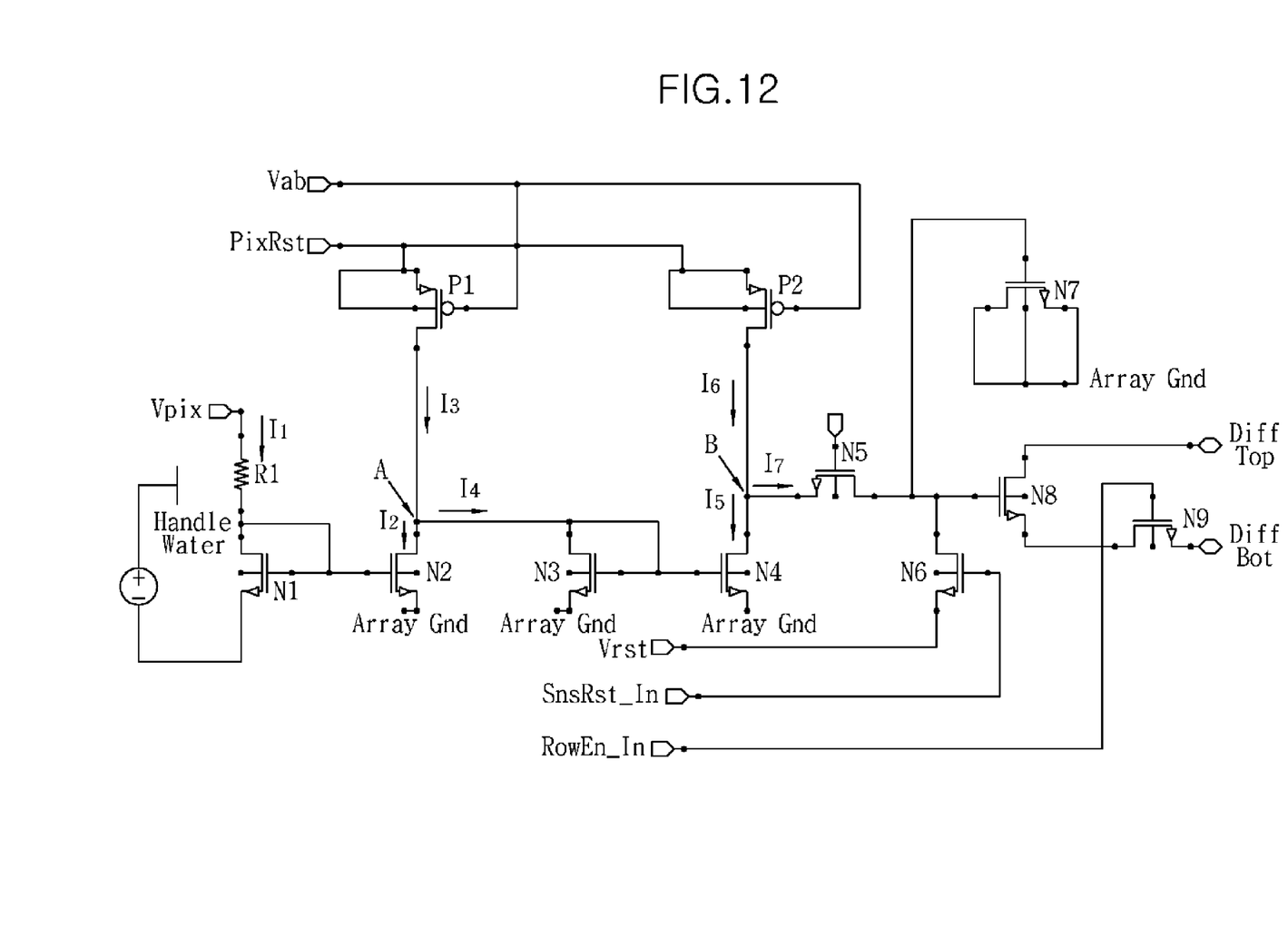
FIG. 12 is a circuit diagram of a detailed circuit structure of a pixel in an infrared sensor according to an exemplary embodiment.

FIG. 12 is a circuit diagram of a detailed circuit structure of a driving circuit for a pixel in an infrared sensor according to an exemplary embodiment.

A sensing portion R1 is a thermal sensor with nitride covering as the thermal absorber material. It is important to note that an N-channel metal-oxide semiconductor (NMOS) N1 is connected as a diode and a drain of the NMOS N1 will not vary far from Vth.

Referring to FIG. 10 again, the detecting portion 220 in the sensing circuit 200 in accordance with the exemplary embodiment includes NMOS transistors N1, N2, N3, and N4, and PMOS transistors P1 and P2, and the output portion 230 (or CIS scanning portion in FIG. 11B) includes NMOS transistors N5, N6, N7, N8, and N9. The circuit structure of FIG. 12 corresponds to the circuit structure of FIG. 11A. A copied current I7 of the current according to the resistance changed by the infrared radiation of the sensing portion R1 flows in a node B between the PMOS transistor P2 and the NMOS transistor N4.

The first common mode current supplying portion 221 and the second common mode current supplying portion 222 correspond respectively to the PMOS transistor P1 and PMOS transistor P2, each of which is driven by a voltage Vab.

The voltage Vab is a bias voltage for constant current to flow into each of the PMOS transistors P1 and P2.

The sensing circuit 200 in accordance with the exemplary embodiment operates in sensing, readout, and reset modes. The sensing circuit 200 receives IR radiation and generates variable current in the sensing mode, the sensing circuit 200 reads out the varied current in the readout mode, and the sensing circuit 200 resets the heat radiated by the sensing portion R1.

During the sensing period, Vpix is set to about 0 volt, and the other signals do not operate, and the heat is collected in the resistor R1.

During the readout period, Vpix is set to about 2 volts, and a certain amount of current flows in the resistor R1 according to the resistance dependant upon temperature.

To reset the sensor, in other words, to deflect the sensor such that it contacts the handle wafer and dumps its heat, Vpix is driven to about 0 volts and a large voltage of approximately 4 volts may be applied to the handle wafer. No other signals are activated. When the reset voltage is applied, the resistor R1 deflects to contact the handle wafer and is thermally reset. It is important that each end of the resistor, to which the reset voltage is applied, stays around the 0~range to ensure operation of the MEMS structure.

Hereinafter, the circuit operation during the readout period will now be described.

In FIG. 12, the MNOS transistor N1 and the NMOS transistor N2 are circuits corresponding to the first current mirror 223 in FIG. 11A. Therefore, the current I2 flowing into a drain of the transistor N2 is the same as the current Io, and when the resistance is changed by the infrared radiation, the current becomes Io+Is.

The current I3 flowing into the PMOS transistor P1 is twice of the current Io due to the bias voltage Vab. Hence, the current I4 flowing out of the node A is Io−Is.

The NMOS transistor N3 and the NMOS transistor N4 correspond to the second current mirror 224 in FIG. 11A. Hence, the current I5 flowing into a drain of the NMOS transistor N4 is Io−Is, which is the same as the current I4. Due to the bias voltage Vab, the current I6 flowing out of the drain of the PMOS transistor P2 is Io. Therefore, the current I7 flowing out of the node B becomes Is.

The transistor configuration of the detecting portion 220 may be simplified such that it corresponds to the circuit configuration illustrated in FIG. 11B. In this case, the PMOS transistor P1 and the NMOS transistors N2 and N3 can be removed from the original circuit, and a gate of the NMOS transistor N1 is connected to a gate of the NMOS transistor N4.

The NMOS transistors N5, N6, N8, and N9 respectively correspond to a transfer transistor, a reset transistor, a driving transistor, and a selection transistor in a CMOS image sensor structure. The NMOS transistor N7 acts as a capacitor which is optimized for conversion of the current I7 into a voltage on the gate capacitance of the NMOS transistor N7.

The NMOS transistor N5 is a transfer transistor for selectively transferring the amount of electric charges from the node B to the capacitor N7. The NMOS transistor N6 can reset the electric charges charged in the capacitor N7, and the NMOS transistor N8 drives a source end in response to the voltage from the capacitor N7. The NMOS transistor N9 selectively outputs the driven outputs.

The capacitor N7 is set to a particular voltage by the NMOS transistor N6 which is controlled by a driving voltage SnsRst_In. The current I7 is transferred to the capacitor by the driving of the gate voltage of the transfer transistor N5 for the amount of electric charges to be added or subtracted from the capacitor N7. The NMOS transistor N6 is used to pre-bias the sense node to various voltages to optimize the operation of the sensor. The transfer transistor N5 connecting to the sensing portion RI allows the shutter action of the array.

When the integration is finished which is the infrared radiation period, the amount of the electric charges of the capacitor N7 is obtained by subtracting Tint (integration period)*I7 from the initial amount of the electric charges, and the current is converted into the voltage in the capacitor N7 and the converted value is stored. When a gate voltage RowEn_In is applied to the selection transistor N9, the voltage stored in the capacitor N7 is output as an output voltage (Difftop).

A double read operation including resetting, reading, charging and reading, such as a correlated double sampling (CDS) may be performed in the circuit described above to remove offsets across the array.

The transfer transistor N9 is used to enable the readout transistors onto a column circuit to read out the array one row at a time. The sensor operates identical to the operation of a CIS in fact that one data is the read out operation of the capacitor N7.

The circuit of FIG. 12 is a sensing circuit of a pixel. In a pixel array formed of multiple pixels, the output voltage is read out and stored in each row, and the readout voltage passes through an output amplifier (not shown), undergoing the an image signal processing, and is output.

The pixel array circuit should read the parametric shift of the sensor. Therefore, the readout can be performed across the whole pixel array simultaneously to provide a shutter action. Furthermore, the common mode signal subtraction can be ideally accomplished in the pixel to provide the highest performance.

According to a configuration of a semiconductor device in accordance with an exemplary embodiment, only a sensing current is detected by a circuit that generates a common mode current so that subtle changes in electric current can be precisely identified to raise the sensitivity.

Also, the semiconductor device removes heat accumulated in a sensing portion mechanically under the control of an electric circuit, and thus the heat is removed easily and efficiently.

In addition, in the semiconductor device according to the exemplary embodiment, a circuit that removes accumulated heat is connected with a sensing circuit, thereby enabling the efficient circuit arrangement for the semiconductor device.

Moreover, according to a configuration of a semiconductor device in accordance with an exemplary embodiment, as a single crystalline silicon thin film formed by any methods such as a thin-film transfer is used for a sensing portion, the performance of the semiconductor device can be substantially improved thanks to a low noise characteristic of the single crystalline silicon.

In addition, according to the exemplary embodiment, single crystalline silicon by the use of a SOI method such as thin-film transfer is formed in a serpentine structure, and hence a high resistibility is achieved and the performance of the semiconductor is consequently enhanced.

Since an oxide layer directly below a sensing portion is easily etched in the course of removal of the oxide layer due to the serpentine structure, the fabrication efficiency of the semiconductor device can be improved.

Furthermore, according to an exemplary embodiment, since there is difference in a coefficient of thermal expansion between the light receiving portion and the sensing portion, the performance improvement of the semiconductor device can be achieved by additional increase in the resistance.

Moreover, according to an exemplary embodiment, a silicon on insulator (SOI) method enables the efficient use of single crystalline silicon of the semiconductor device.

Also, according to an exemplary embodiment, since accumulated heat is reset based on a MEMS-based reset structure, the performance of the sensing unit is not dependent upon the sensitivity, thereby enabling high-speed operation of the semiconductor device, remaining debris of a previous image is removed, and the sensitivity and operational speed are maximized.

Additionally, due to the MEMS-based reset structure, since transistors can be placed at a lower part of each of the light receiving portion and the sensing portion, there is not required an additional horizontal space for the semiconductor device.

Finally, according to an exemplary embodiment, elements required for a sensing circuit that detects a voltage corresponding to the resistance of the sensing unit, which changes according to accumulated heat are fabricated by use of the CMOS fabrication method, and thus the semiconductor device can be manufactured efficiently.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A semiconductor device comprising:
   a sensor configuration which includes a light receiving portion for converting incident photons into heat and a sensing portion integrated with the light receiving portion and having a resistance varying according to the converted heat; and
   a sensing circuit which includes:
      a first current mirror in which a current flows corresponding to a current flowing in the sensing portion;
      a first common mode current providing portion which outputs a first common mode current having a size corresponding to a multiple of a value of a current which is flowing in the sensing portion when there is no incident light;
      a first current subtraction portion which outputs a subtraction current by subtracting an output from the first common mode current providing portion from an output from the first current mirror;
      a second current mirror in which a current flows corresponding to an output from the first current subtraction portion,
      a second common mode current providing portion which outputs a second common mode current having a size corresponding to the first common mode current from the first common mode current providing portion; and
      a second current subtraction portion which outputs a subtraction current by subtracting the second common mode current from the second common mode current providing portion and an output from the second current mirror.

2. The semiconductor device of claim of claim 1, wherein the sensing configuration includes a heat removing portion which is disposed to form an empty space between the heat removing portion and the light receiving portion and the sensing portion, and removes accumulated heat from the light receiving portion and the sensing portion.

3. The semiconductor device of claim 1, wherein the sensing circuit includes an actuating voltage supplying portion which applies electric potential between the sensing portion and the heat removing portion to make the light receiving portion and the sensing portion elastically deflect into the empty space and consequently contact the heat removing portion to remove the heat.

4. The semiconductor device of claim 1, wherein the sensing circuit is placed under or beside the sensor configuration.

5. The semiconductor device of claim 1, wherein the sensing portion is a single-crystalline silicon thin film formed by a silicon on insulator (SOI) substrate fabrication method.

6. A method of operating a semiconductor device which includes a sensor configuration which includes a light receiving portion for converting incident photons into heat and a sensing portion integrated with the light receiving portion and having a resistance varying according to the converted heat and a sensing circuit for measuring the varying resistance, the method comprising:
   providing a current flow corresponding to a current flowing in the sensing portion using a first current mirror;
   outputting a first common mode current having a size corresponding to a multiple of a value of a current which is flowing in the sensing portion when there is no incident light;
   outputting a subtraction current by subtracting the first common mode current from an output from the first current mirror;
   providing a current flow corresponding to an output from the first current subtraction portion using a second current mirror;
   outputting a second common mode current having a size corresponding to the first common mode current; and
   outputting a subtraction current by subtracting the second common mode current and an output from the second current mirror.

7. The method of claim 6, wherein the sensing configuration further includes a heat removing portion which is disposed to form an empty space between the heat removing portion and the light receiving portion and the sensing portion, further comprising:
   removing accumulated heat from the light receiving portion and the sensing portion by applying electric potential between the sensing portion and the heat removing portion to make the light receiving portion and the sensing portion elastically deflect into the space to contact the heat removing portion.

* * * * *